United States Patent
Wu

(10) Patent No.: US 6,429,106 B1
(45) Date of Patent: Aug. 6, 2002

(54) METHOD OF AUTOMATICALLY DEFINING A LANDING VIA

(75) Inventor: King-Lung Wu, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/764,331

(22) Filed: Jan. 19, 2001

(51) Int. Cl.⁷ ...................... H01L 21/3205; H01L 21/44
(52) U.S. Cl. ...................... 438/586; 438/587; 438/595; 438/597
(58) Field of Search .................. 438/791, 585–587, 438/595, 597, 599

(56) References Cited

U.S. PATENT DOCUMENTS 5,894,065 A * 4/1999 Brambilla et al. .......... 438/265
5,956,594 A * 9/1999 Yang et al. ................. 438/396

* cited by examiner

*Primary Examiner*—Ha Tran Nguyen
(74) *Attorney, Agent, or Firm*—Winston Hsu

(57) ABSTRACT

The present invention provides a method of automatically defining a landing via on a semiconductor wafer. The present invention involves first forming a conductive layer and a photoresist layer on the surface of the semiconductor wafer. Then, patterns of a plurality of word lines are defined on the surface of the photoresist layer, and patterns of a plurality of auxiliaries are defined around the area predetermined to form the landing via between each two word lines on the surface of the photoresist layer. Thereafter, the patterned photoresist layer is used as a hard mask to etch the conductive layer to form each word line on the semiconductor wafer, and to simultaneously form the auxiliaries around the area predetermined to form the landing via. Finally, a plurality of spacers are formed around each word line and each auxiliary dovetail together to form a landing via hole and to automatically define the position of the landing via.

4 Claims, 6 Drawing Sheets

METHOD OF AUTOMATICALLY DEFINING A LANDING VIA

BACKGROUND OF THE INVENTION

1. Field of the Invention

The present invention provides a method of automatically defining a landing via of a semiconductor wafer.

2. Description of the Prior Art

A dynamic random access memory (DRAM) is forme by numerous single transistors or otherwise known as DRAM memory cells. Each memory cell is composed of a metal oxide semiconductor (MOS) transistor and a capacitor connected in series. The design theory of DRAM involves the use of the MOS transistor as a switch for controlling a bit line so as to read data stored in the capacitor. A word line electrically connects with a source/drain of the transistor by first filling conductive materials in a bit contact hole. The conductive material filling in a node contact hole is used as an electrical connecting line to connect the underground electrode of a capacitor and a source/drain of a transistor.

The prior method of forming contact holes commonly uses high etching selectivity to perform a self-aligned contact etching. Both a landing pad and another contact plug are simultaneously formed in the bottom of an electrode contact to both reduce the difficulty of the electrode contact process and to increase the mis-alignment tolerance of the etching process so as to ensure the electrical properties of the entire DRAM.

However, as the size of semiconductor devices decreases, the aperture of contact holes also decreases correspondingly. Thus, it becomes increasingly difficult to form the electrode contact using only lithographic and etching processes. Modification of process will ensure yield, but does not solve the complicated steps involved in the self-aligned etching process. Therefore, an important factor in current semiconductor processes is the ability to simplify the method of fabricating contact holes in accordance with the increasing integration of semiconductor devices.

Please refer to FIG. 1 to FIG. 5. FIG. 1 to FIG. 5 are schematic diagrams for a prior art method of forming a landing pad 29. The prior art method of forming the landing pad 29 is performed on a semiconductor wafer 10, which employs a first photoresist layer 20 and a second photoresist layer 28 to define the positions of a contact plug 27 and the landing pad 29. As shown in FIG. 1, the semiconductor wafer 10 comprises a silicon substrate 12, a first dielectric layer 18 positioned on the silicon substrate 12, and a first photoresist layer 20 positioned on the first dielectric layer 18. Two gates 14, 16 are positioned on the silicon substrate 12, covered by the first dielectric layer 18, with a spacer 17 positioned on either side, respectively. The first photoresist layer 20 comprises an opening 22, extending down to the surface of the first dielectric layer 18, and positioned between the two gates 14, 16 for defining the position of the contact plug 27.

As shown in FIG. 2, an anisotropic etching process is performed to vertically remove the first dielectric layer 18 beneath the opening 22 to form a contact hole 24. Then, a stripping process is performed to remove the first photoresist layer 20 on the dielectric layer 18. Next, as shown in FIG. 3, a polysilicon layer 26 is formed on the semiconductor wafer 10 to fill the contact hole 24. Next, as shown in FIG. 4, a second photoresist layer 28 is formed on a predetermined area of the semiconductor wafer 10 above the contact hole 24 for defining the position of the landing pad 29.

Finally, as shown in FIG. 5, the polysilicon layer 26 not covered by the second photoresist layer 28 is removed and the residual polysilicon layer 26 becomes a conductive layer 26a. After the second photoresist layer 28 is removed, the landing pad 29 is completed. The top of the conductive layer 26a is used as the landing pad 29 and the bottom of the conductive layer 26a is used as the contact plug 27 for electrically connecting the landing pad 29 with a drain/source positioned under the silicon substrate 12.

Please refer to FIG. 6. FIG. 6 is a sectional schematic diagram of a capacitor formed on the landing pad 29 shown in FIG. 5. In DRAM processing, the surface of the semiconductor wafer 10 is usually defined and differentiated as both an array area 11 where the memory cells of the DRAM are formed, and a periphery area 13 where the periphery circuits are formed. After both the formation of the gates 14, 16 in the array area 11 and at least one gate 15 in the periphery area 13, the landing pad 29 and a capacitor are formed in the array area 11. Then, an interconnecting process is simultaneously performed in both the array area 11 and the periphery area 13 for electrically connecting the memory cell and the periphery circuits with the external circuitry.

According to the above-mentioned DRAM process, a second dielectric layer 30, a node contact 31, a bottom storage node 32, a third dielectric layer 33 and an upper field plate 34 are sequentially formed after the completion of the landing pad 29 in the array area 11. The bottom storage node 32, the third dielectric layer 33 and the upper field plate 34 together form a capacitor 39. One of the gates 14, 16, the contact plug 27, the landing pad 29 the node contact 31 and the capacitor 39 together form a memory cell 40.

Next, the interconnecting process is performed to form a fourth dielectric layer 35 on the semiconductor wafer 10 followed by an etching process. Therefore, a first groove (not shown) extending down to the upper field plate 34 is formed in the array area 11 as a channel for electrically connecting the memory cell with the external circuitry. Concurrently, a second groove 38 extending down to the silicon substrate 12 is formed in the periphery area 13 as another channel for electrically connecting the periphery circuits with the external circuitry.

In the prior art method, the lithographic process must be performed twice in the formation of the first photoresist layer 20 and the second photoresist layer 28 to define the position of the landing pad 29. Consequently, the result is a complicated process that is difficult to control. In addition, the sequentially-formed node contact 31 may electrically interact with a bit line (not shown) within the second dielectric layer 30 to cause product defect.

Furthermore, the landing pad 29 is formed on the first dielectric layer 18 and is electrically connected to the silicon substrate 12 with the contact plug 27 positioned within the first dielectric layer 18. Consequently, the thickness of the memory cell 40 subsequently formed in the array area 11 is very large. Therefore, the distance from the surface of the fourth dielectric layer 35 to the surface of the silicon substrate 12 is effectively great to cause difficulty in the formation of the second groove 38.

SUMMARY OF THE INVENTION

It is therefore a primary objective of the present invention to provide a method of automatically defining a landing via of a semiconductor wafer, and more particularly, a method of fabricating each landing pad on the source and drain of a MOS transistor without the use of a photoresist layer to define the position of the landing pad.

In a preferred embodiment of the present invention, the semiconductor wafer comprises a substrate and a conductive layer formed on the surface of the semiconductor wafer. The present invention involves first forming a photoresist layer on the surface of the conductive layer. Then patterns of a plurality of word lines are defined on the surface of the photoresist layer, and patterns of a plurality of auxiliaries are defined around the area predetermined to form the landing via between each two word lines on the surface of the photoresist layer. Thereafter, the patterned photoresist layer is used as a hard mask to etch the conductive layer to form each word line on the semiconductor wafer, and to simultaneously form the auxiliaries around the area predetermined to form the landing via. Finally, a plurality of spacers are formed around each word line and each auxiliary dovetail together to form a landing via hole and to automatically define the position of the landing via.

In the present invention, when defining patterns of each word line on the photoresist layer, patterns of a plurality of auxiliaries are simultaneously defined around the area predetermined to form the landing via between each two word lines on the surface of the photoresist layer. Thus, in the subsequent etching process of forming each word line, the auxiliaries are simultaneously formed around the area predetermined to form the landing via. Furthermore, a plurality of spacers formed around each word line and each auxiliary dovetail together to form a landing via hole and to automatically define the position of the landing via.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
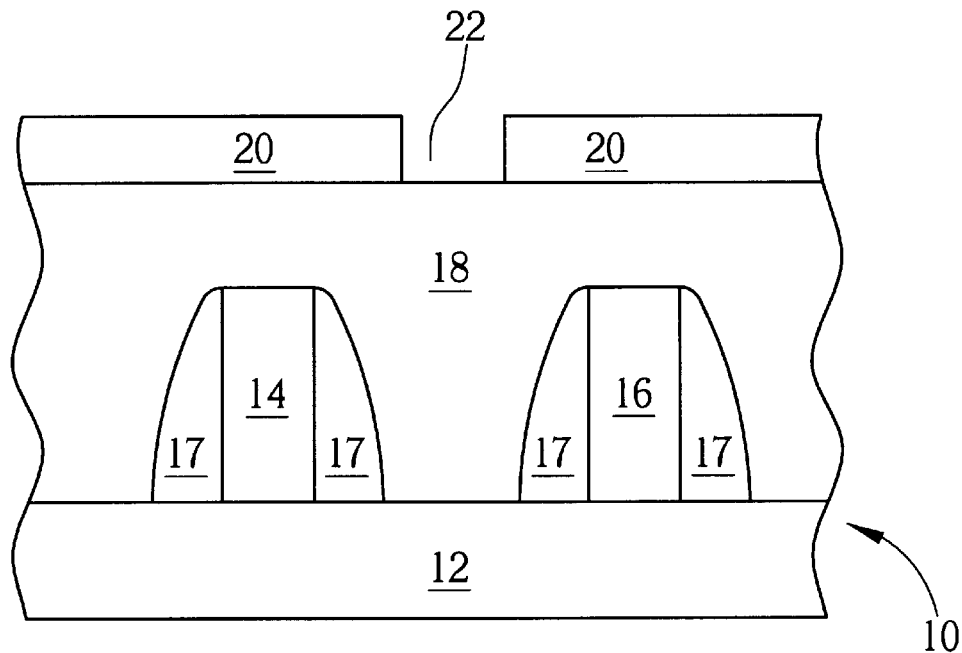
FIG. 1 to FIG. 5 are schematic diagrams of a prior art method of forming a landing pad.
Figure 2:
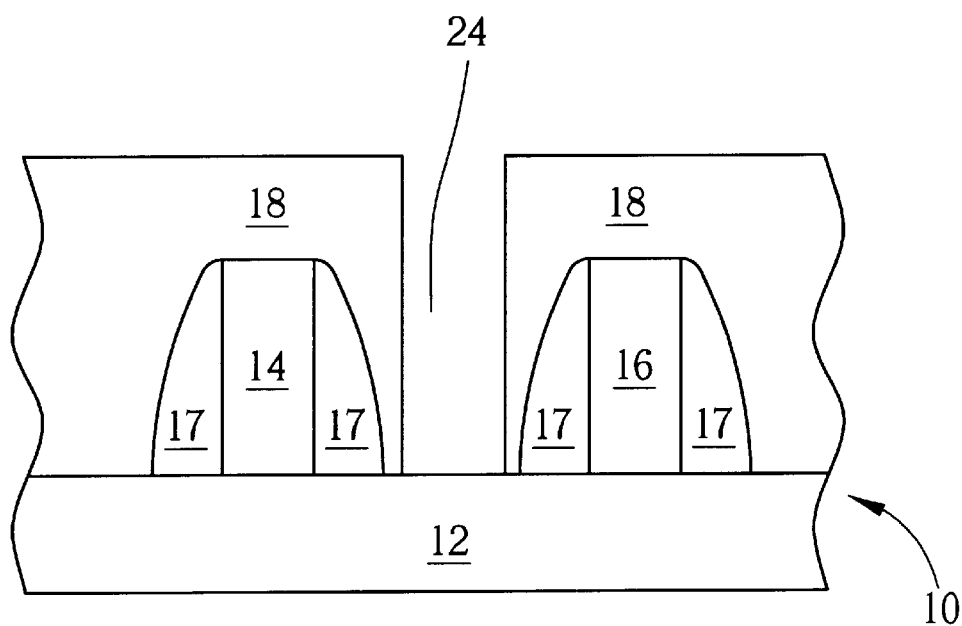
Figure 3:
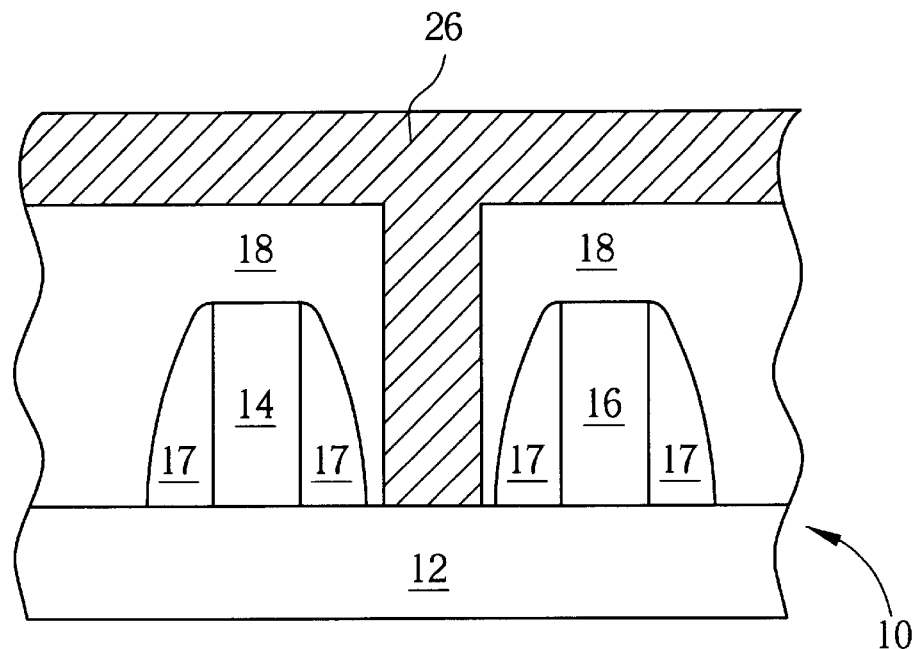
Figure 4:
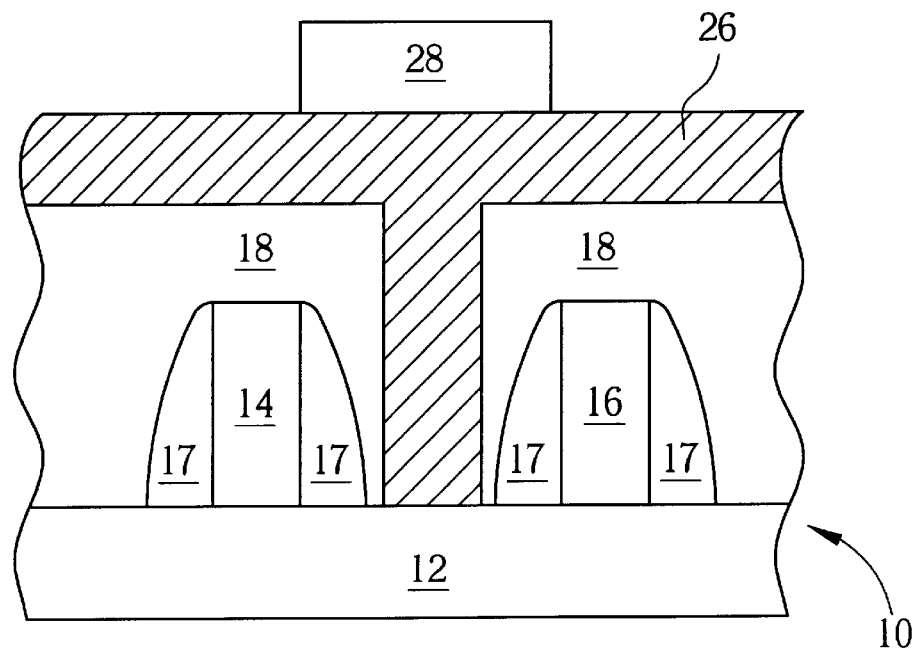
Figure 5:
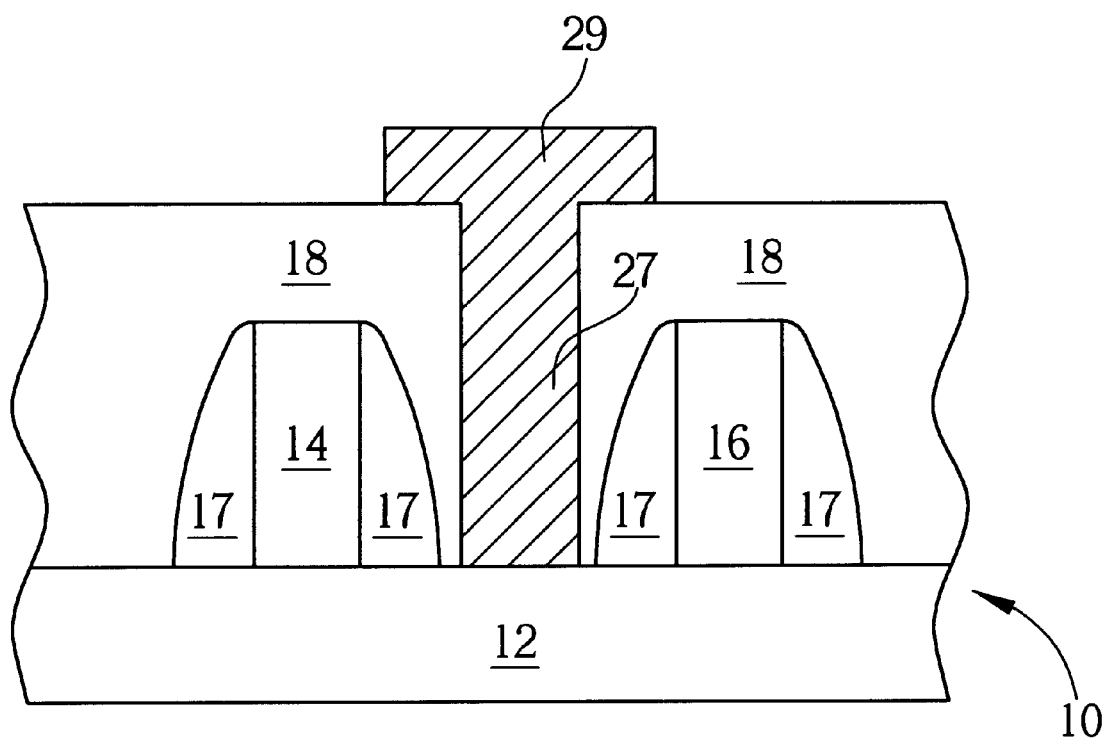
Figure 6:
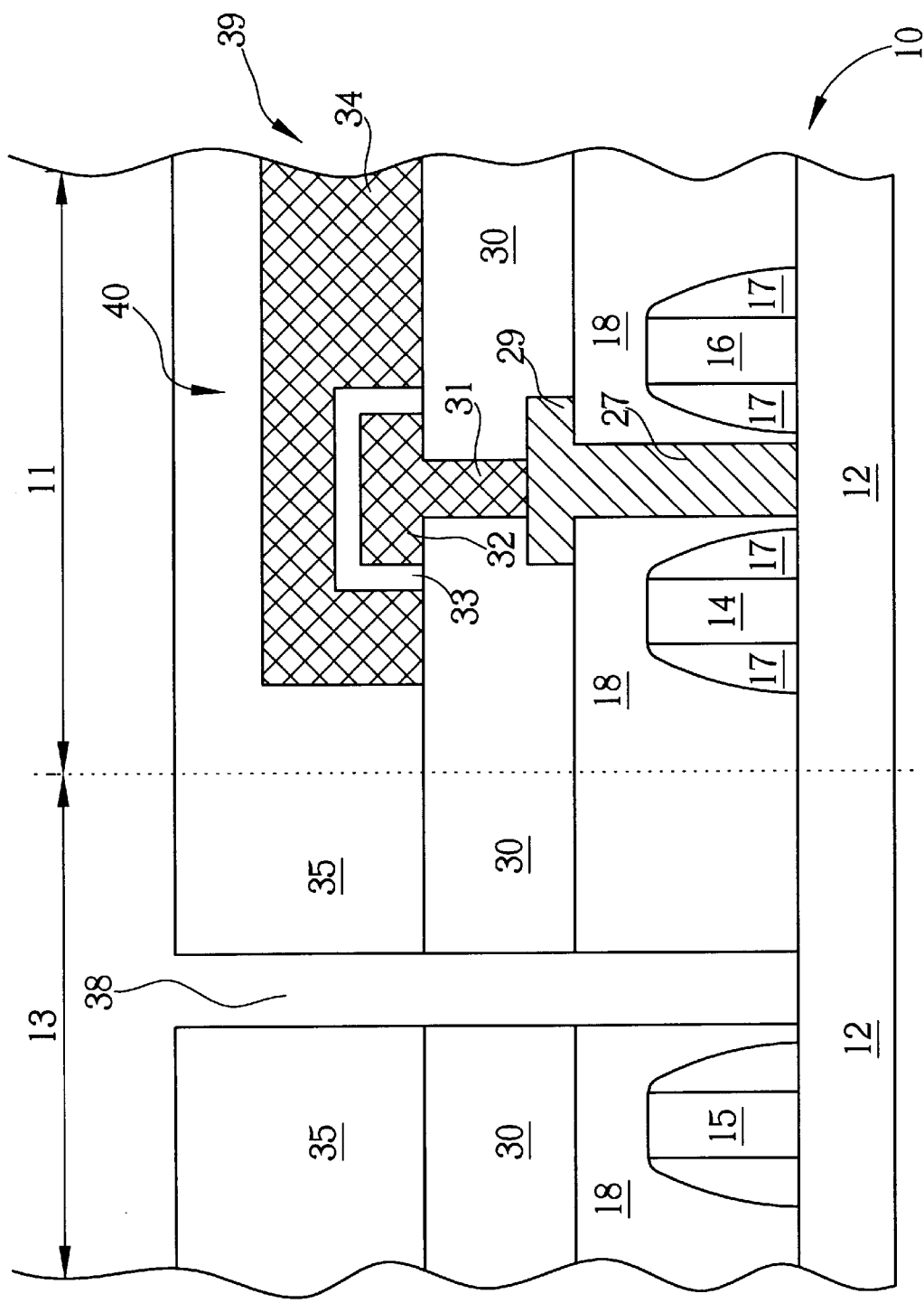
FIG. 6 is a sectional schematic diagram of a capacitor formed on the landing pad showed in FIG. 5.
Figure 7:
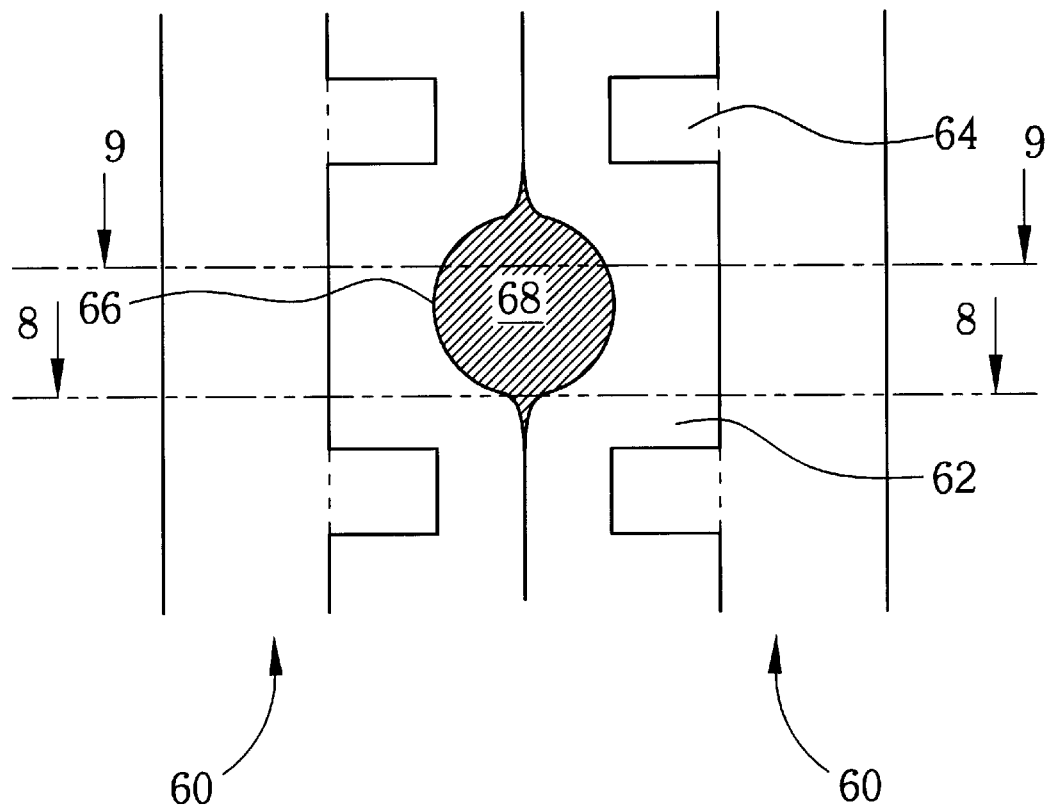
FIG. 7 is a top-view diagram of a landing via formed by the present invention.
Figure 8:
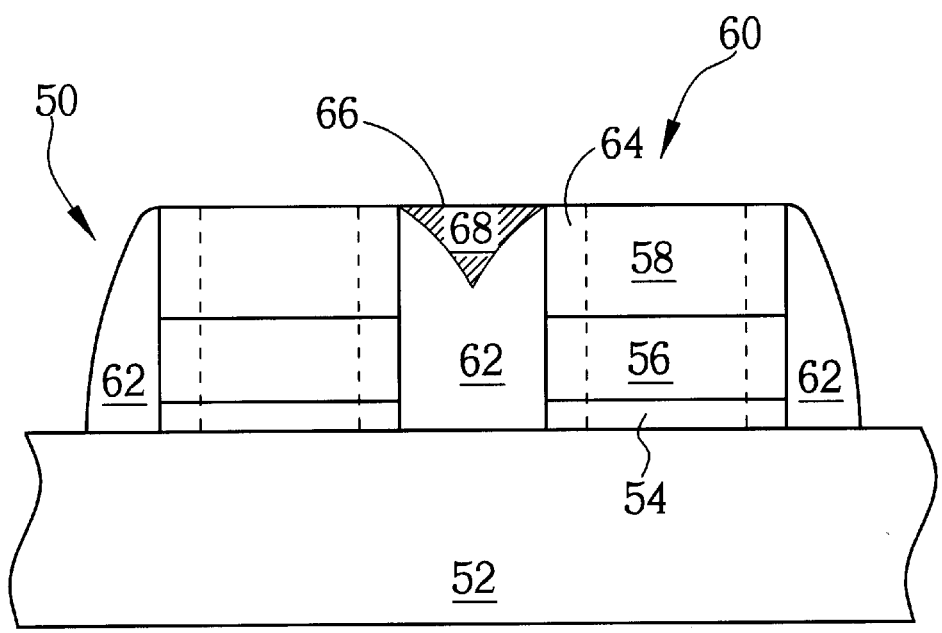
FIG. 8 is a sectional schematic diagram along the tangent line 8—8 shown in FIG. 7.
Figure 9:
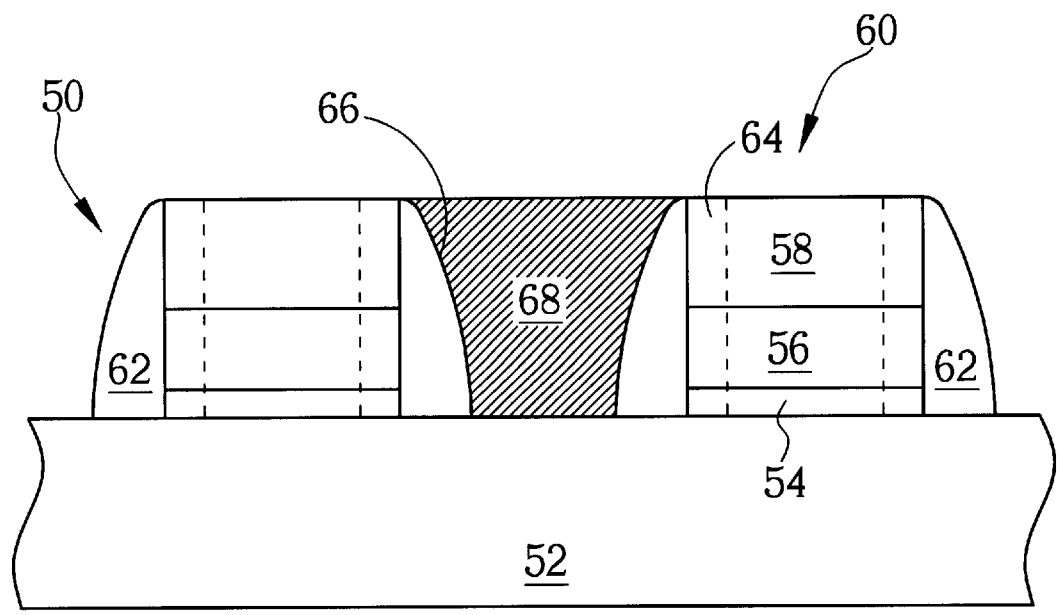
FIG. 9 is a sectional schematic diagram along the tangent line 9—9 shown in FIG. 7.

The present invention provides a method for automatically defining the landing via 68 of a semiconductor wafer 50. Please refer to FIG. 7 to FIG. 9. FIG. 7 is a top-view diagram of the landing via 68 in the present invention, FIG. 8 is a sectional diagram along the tangent line 8—8 shown in FIG. 7, and FIG. 9 is a sectional diagram along the tangent line 9-9 shown in FIG. 7. The semiconductor wafer 50 comprises a substrate 52 composed of monocrystalline silicon and at least two word lines 60 positioned on the substrate. The word line 60 is composed of a gate oxide layer 54, a first polysilicon layer 56 and a silicon nitride layer 58, respectively.

The method of manufacturing the landing via 68 according the present invention involves first forming a gate oxide layer 54, a polysilicon layer 56, a silicon nitride layer 58 and a photoresist layer (not shown), respectively. Next, a photoresist pattern of a word line 60 is used to perform a photolithographic, exposure and development process for defining patterns of a plurality of word lines 60. Thereafter, the patterned photoresist layer is used as a hard mask to perform an etching process to form each word line 60 on the semiconductor wafer 50. The patterns of the word line 60 in the photoresist layer contains another pattern of a plurality of auxiliaries 64 positioned around the area predetermined to form the landing via 68. In other words, an auxiliary 64 is formed around the area predetermined to form the landing via 68 between each two word lines 60.

In the present invention, when forming each word line 60, a plurality of auxiliaries 64 are simultaneously formed around the area predetermined to form the landing via 68 between each two word lines 60. Each auxiliary 64 connects with each word line 60 and is formed together with each word line 60 in the etching process. Consequently, the composition of each auxiliary 64 is same as that of the word line 60.

As shown in FIG. 7, after forming each word line 60 and auxiliary 64 connecting with each word line 60, a plasma etching process is performed on the surface of the semiconductor wafer 50 to completely remove the photoresist layer on the semiconductor wafer 50. Thereafter, a silicon nitride layer (not shown) is formed on the semiconductor wafer 50, and an etching-back process is used to form a spacer 62 composed of silicon nitride around each word line 60. A portion of the spacer 62 around each auxiliary 64 connects with the portion of the spacer 62 formed on the sidewall of other neighboring auxiliary 64. In the prior art, the spacer is formed between each two word lines 60 where no auxiliary 64 is positioned.

A vacant space exists in the area predetermined to form the landing via 68 between each two word lines 60 due to the connecting spacers 62. A landing via hole 66 is therefore formed to reach the surface of the substrate 52. As well, the present invention can also use the same or different materials to perform the two spacer-forming processes. Spacers (not shown) of each device on the semiconductor wafer 50 are first formed, and the connecting spacers 62 are formed secondly to ensure a vacant space exits in the area of the landing via 68 to form a landing via hole 66.

A doped polysilicon layer (not shown) is formed on the semiconductor wafer 50 and fills each landing via hole 66. Then, an etching-back or a wet etching process is used to remove portions of the doped polysilicon layer to cause the polysilicon layer in each landing via hole 66 to be independent and disconnected for forming each landing via 68. Simultaneously, the etching process prevents a conductive connecting bridge from forming between each landing via hole 66 to cause short-circuiting via the formation of the doped polysilicon layer on the surface of the semiconductor wafer 50.

Figure 10:
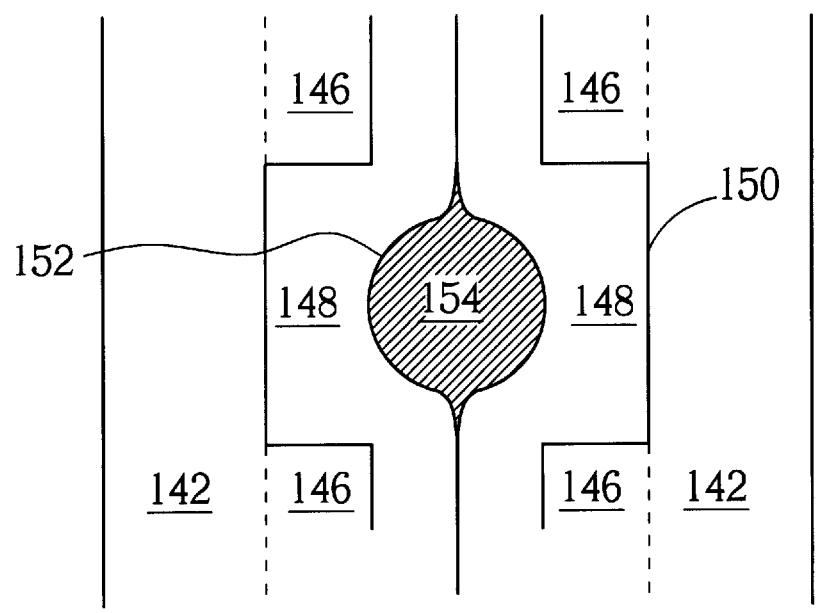
FIG. 10 is another embodiment of the present invention.

Please refer to FIG. 10. FIG. 10 is another embodiment in the present invention. The primary differences between the embodiment shown in FIG. 10 and FIG. 7 are: the word line 142 shown in FIG. 10 has a wider line width, and the area predetermined to form the landing via between each two word lines 142 sinks towards the center of the word line 142 to form an approximate rectangular region 150. In a subsequent process, a vacant space exists between the spacers 148 in the rectangular region 150 to form a landing via hole 152 directly reaching the surface of the substrate. Also, the embodiment shown in FIG. 10 is similar to that of the embodiment shown in FIG. 7, but the auxiliaries 146 formed on the two sides of each word line 142 is longer and the neighboring four auxiliaries 146 define the corresponding area predetermined to form a landing via.

As well, the present invention can also be applied in the method of fabricating a node contact hole. More specifically, when designing the photoresist mask of bit lines, an auxiliary pattern is defined around the area predetermined to form the node contact hole on the photoresist layer, and each auxiliary pattern is positioned in each corner of the area predetermined to form each node contact hole. Then, an anisotropic etching process is performed to vertically etch down and form each bit line, and simultaneously form an auxiliary around the area predetermined to form each node contact between each two bit lines. The composition of the auxiliary and the bit line is the same. Finally, a spacer is formed around each bit line and the portions of spacers around each auxiliary connect with spacers formed on the sidewalls of other neighboring auxiliaries to compose each node contact hole. In comparison, the prior art spacer is formed between each two bit lines where no auxiliary is positioned.

In contrast to the prior art method, the primary object of the present invention is to provide a simplified method of fabricating both a word line landing via and a node contact landing via of a MOS transistor. In the present invention, a lithographic process to define the positions of both plug holes and landing pads are not required and a subsequent etching process used in the prior art is also omitted. As well, each landing via hole is automatically defined, and thus the pitch of each word line (bit line) is relatively decreased so as to increase the integration of semiconductor products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of automatically defining a landing via on a semiconductor wafer, the semiconductor wafer comprising a substrate, the method comprising:

forming a conductive layer on the surface of the substrate;

forming a photoresist layer on the conductive layer;

defining patterns of a plurality of word lines on the surface of the photoresist layer, and defining patterns of a plurality of auxiliaries around an area of a rectangular-shaped region predetermined to form the landing via between each two word lines on the surface of the photoresist layer, and each of the auxiliaries is positioned at each corner of the rectangular-shaped region;

using the patterns defined on the photoresist layer as a hard mask to etch the conductive layer for forming each word line on the semiconductor wafer and the auxiliaries simultaneously form around the area predetermined to form the landing via; and forming a plurality of spacers around each word line and each auxiliary;

wherein the spacers formed on said area around each two adjacent auxiliaries dovetail together to form a landing via hole thereby automatically defining a position of the landing via.

2. The method of claim 1 wherein the spacer is made of silicon nitride.

3. A method of automatically forming a landing via on a semiconductor wafer, the semiconductor wafer comprising a substrate, the method comprising:

forming a first conductive layer on the surface of the substrate;

forming a photoresist layer on the first conductive layer;

defining patterns of a plurality of word lines on the surface of the photoresist layer, and defining patterns of a plurality of auxiliaries around an area of a rectangular-shaped region predetermined to form the landing via between each two word lines on the surface of the photoresist layer, and each of the auxiliaries is positioned at each corner of the rectangular-shaped region;

using the patterns defined on the photoresist layer as a hard mask to etch the conductive layer for forming each word line on the semiconductor wafer and the auxiliaries simultaneously form around the area predetermined to form the landing via; and forming a plurality of spacers around each word line and each auxiliary:

wherein the spacers forming around each word line and each two adjacent auxiliaries, and each spacer formed on said area around each auxiliary dovetail together to respectively form a plurality of landing via holes; and forming a second conductive layer in each of the via holes to finish the formation of the landing vias.

4. The method of claim 3 wherein the spacer is made of silicon nitride.

* * * * *